(12) United States Patent
Briggs et al.

(10) Patent No.: US 10,446,496 B2
(45) Date of Patent: Oct. 15, 2019

(54) SELF-FORMING BARRIER FOR COBALT INTERCONNECTS

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Takeshi Nogami, Schenectady, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/045,729

(22) Filed: Feb. 17, 2016

(65) Prior Publication Data
US 2017/0236749 A1    Aug. 17, 2017

(51) Int. Cl.
*H01L 23/535* (2006.01)
*H01L 21/768* (2006.01)
*H01L 23/532* (2006.01)

(52) U.S. Cl.
CPC ...... *H01L 23/535* (2013.01); *H01L 21/76843* (2013.01); *H01L 21/76867* (2013.01); *H01L 21/76877* (2013.01); *H01L 21/76883* (2013.01); *H01L 21/76895* (2013.01); *H01L 23/5329* (2013.01); *H01L 23/53209* (2013.01)

(58) Field of Classification Search
CPC ......... H01L 21/76867; H01L 21/76883; H01L 23/53209

USPC .......................... 257/751; 438/627, 629, 662
See application file for complete search history.

(56) References Cited

U.S. PATENT DOCUMENTS

| | | | |
|---|---|---|---|
| 5,190,889 A | 3/1993 | Poon et al. | |
| 6,077,780 A * | 6/2000 | Dubin | H01L 21/76834 257/E21.584 |
| 7,867,891 B2 | 1/2011 | O'Brien et al. | |
| 8,035,230 B2 | 10/2011 | Arakawa | |
| 8,508,018 B2 | 8/2013 | Akolkar et al. | |
| 2002/0089063 A1 * | 7/2002 | Ahn | H01L 21/28562 257/762 |
| 2005/0181598 A1 * | 8/2005 | Kailasam | H01L 21/76802 438/654 |
| 2006/0063382 A1 | 3/2006 | Dubin et al. | |

(Continued)

FOREIGN PATENT DOCUMENTS

WO    2011/050073 A1    4/2011

OTHER PUBLICATIONS

Office Action Issued in U.S. Appl. No. 15/475,275 dated Nov. 17, 2017, 15 pages.

(Continued)

*Primary Examiner* — Herve-Louis Y Assouman
(74) *Attorney, Agent, or Firm* — Tutunjian & Bitetto, P.C.; Vazken Alexanian

(57) ABSTRACT

A method for forming a conductor includes forming trenches in an insulator layer. An alloy layer is deposited in the trenches. The alloy layer includes a conductor material and a barrier material. The alloy layer is annealed to form a barrier layer on the insulator layer and to purify the alloy layer into a conductor layer, such that the barrier material in the alloy layer is driven to an interface between the alloy layer and the insulator layer.

13 Claims, 7 Drawing Sheets

(56) References Cited

U.S. PATENT DOCUMENTS

| | | | |
|---|---|---|---|
| 2006/0113675 A1 | 6/2006 | Chang et al. | |
| 2006/0141700 A1* | 6/2006 | Nam | H01L 21/76829 438/243 |
| 2008/0042291 A1 | 2/2008 | Knarr et al. | |
| 2008/0230375 A1* | 9/2008 | Maekawa | C23C 14/027 204/192.15 |
| 2010/0081271 A1 | 4/2010 | Ishizaka et al. | |
| 2011/0006429 A1* | 1/2011 | Liu | H01L 21/76831 257/751 |
| 2011/0101529 A1* | 5/2011 | Kao | H01L 23/53238 257/751 |
| 2011/0163062 A1 | 7/2011 | Gordon et al. | |
| 2012/0141667 A1* | 6/2012 | Kim | C23C 14/046 427/123 |
| 2013/0260555 A1 | 10/2013 | Zope et al. | |
| 2014/0084466 A1 | 3/2014 | Matsumoto et al. | |
| 2014/0183738 A1* | 7/2014 | Jezewski | H01L 23/485 257/751 |
| 2014/0183742 A1* | 7/2014 | Matsumoto | H01L 23/53266 257/751 |
| 2015/0108646 A1 | 4/2015 | Chae et al. | |
| 2015/0179579 A1 | 6/2015 | Jezewski et al. | |
| 2015/0325622 A1 | 11/2015 | Zhang et al. | |

OTHER PUBLICATIONS

Final Office Action for U.S. Appl. No. 15/475,275 dated Apr. 4, 2018 (18 pages).

U.S. Office Action issued in U.S. Appl. No. 15/475,275 dated Nov. 29, 2018, 21 pages.

* cited by examiner

SELF-FORMING BARRIER FOR COBALT INTERCONNECTS

BACKGROUND

Technical Field

The present invention relates to semiconductor devices and, more particularly, to forming contacts and interconnects for semiconductor devices.

Description of the Related Art

Existing devices predominately use tungsten for the middle of line interconnects and contacts. However, as device dimensions continue to scale down to the 10 nm node and beyond, tungsten structures experience increasing resistance. This increased resistance is partly due to the thick liner materials needed for tungsten adhesion to underlying insulator layers and for the protection of oxides during the tungsten chemical vapor deposition process. These highly resistive liners (e.g., titanium/titanium nitride) occupy a large fraction of the total trench volume, which limits the actual amount of tungsten that may be deposited. A decreased conductor cross section results in an increased resistance for the conductor.

SUMMARY

A method for forming a conductor includes forming trenches in an insulator layer. An alloy layer is deposited in the trenches. The alloy layer includes a conductor material and a barrier material. The alloy layer is annealed to form a barrier layer on the insulator layer and to purify the alloy layer into a conductor layer. The barrier material in the alloy layer is driven to an interface between the alloy layer and the insulator layer A method for forming a conductor includes forming trenches in an insulator layer. A layer of barrier material is deposited in the trenches. The layer of barrier material is annealed to form a barrier layer on the insulator layer. A layer of conductor material is deposited over the barrier layer.

An interconnect for a semiconductor device includes an insulator layer having a trench. A barrier layer is formed on a surface of the trench. An elemental cobalt conductor is formed on the barrier layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide alternatives to the use of fluorine tungsten in conductors, which is difficult to use at small sizes due to the relatively large resistive liners needed. The present embodiments form conductors that use elemental cobalt to conduct currents, which has a lower resistivity than existing materials. To create a resistive liner between cobalt conductor and an underlying insulator layer, a self-forming barrier is created using, e.g., a manganese silicon oxide layer that acts as a cobalt diffusion barrier, protecting the cobalt conductor both from diffusion of its own material into the surrounding insulator and also preventing contaminants, such as oxygen, from damaging the conductor. The barrier is formed at the surface of the underlying insulator, eliminating the need for separate barrier/liner materials, increasing the cross section of the conductor, and providing decreased line resistance.

The creation of the self-forming barrier can be accomplished by depositing a cobalt-manganese alloy and using subsequent thermal processing to drive the manganese to the cobalt/insulator interface. The manganese reacts with the underlying insulator and forms the barrier. Alternatively, a manganese layer may be applied first to the insulator layer and annealed to form the manganese silicon oxide barrier. In this embodiment, the cobalt conductor material may then be filled in over the barrier layer. Although cobalt and manganese are specifically contemplated and discussed herein, it should be understood that the present principles may be applied to other materials to create a self-forming barrier for conductors.

Figure 1:
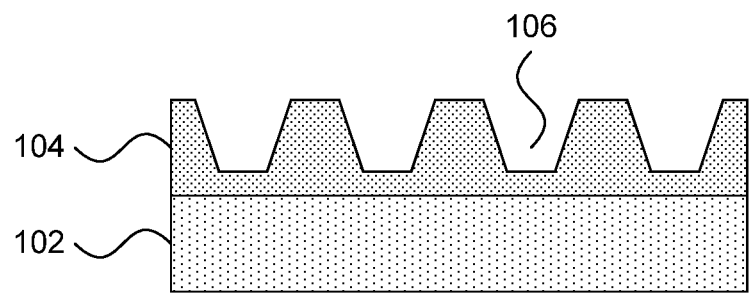
FIG. 1 is a cross-sectional view of an exemplary step in forming a conductor in a trench in accordance with the present principles.

Referring now to the drawings in which like numerals represent the same or similar elements and initially to FIG. 1, a step in forming cobalt conductors is shown. A substrate 102 is used and may be a bulk semiconductor substrate or may, alternatively, be a semiconductor-on-insulator substrate. In one example, the bulk-semiconductor substrate may be a silicon-containing material. Illustrative examples of silicon-containing materials suitable for a bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride, and zinc sellenide. In the case of a semiconductor-on-insulator substrate, an insulator layer (not shown) may be included that may, for example, be formed from silicon dioxide.

A trench layer 104 is formed on the substrate 102. The trenches 106 in the trench layer 104 may be formed by any appropriate process as described below. The trench layer 104 may be formed from the same semiconductor material as the surface of the substrate 102 or may, alternatively, be formed from any other appropriate material such as, e.g., silicon dioxide or another dielectric material. Exemplary dielectrics appropriate to use in the trench layer 104 may include silicon, oxygen, carbon, and/or nitrogen in various proportions and stoichiometries. The material of the trench layer 104 may be a low-k, ultra low-k, or extremely low-k dielectric material, referring to the dielectric constant of the material relative to, e.g., silicon dioxide, which has a dielectric constant of k=3.9. Hybrid dielectrics may also be used that are formed as multilayers of oxides and ultra low-k or extremely low-k dielectrics.

It is particularly contemplated that an anisotropic etch, such as reactive ion etch (RIE), may be used to form the trenches 106, but any other form of lithography (e.g., photolithography) may be used instead. RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 2:
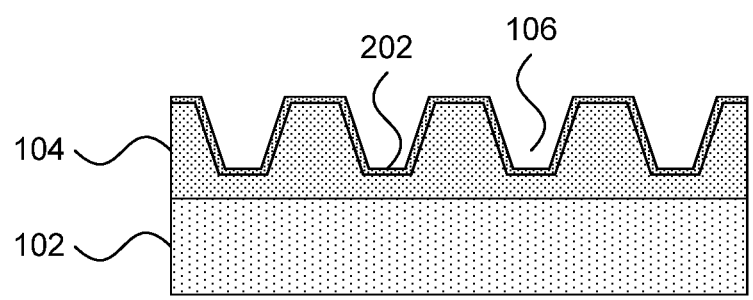
FIG. 2 is a cross-sectional view of an exemplary step in forming a conductor in a trench in accordance with the present principles.

Referring now to FIG. 2, a step in forming cobalt conductors is shown. A layer of cobalt 202 is deposited uniformly and conformally over the trenches 106. It is particularly contemplated that chemical vapor deposition (CVD) may be employed to deposit the cobalt isotropically, but any appropriate deposition process, such as physical vapor deposition (PVD), atomic layer deposition, or gas cluster ion beam (GCIB) deposition may be used. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EP-CVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
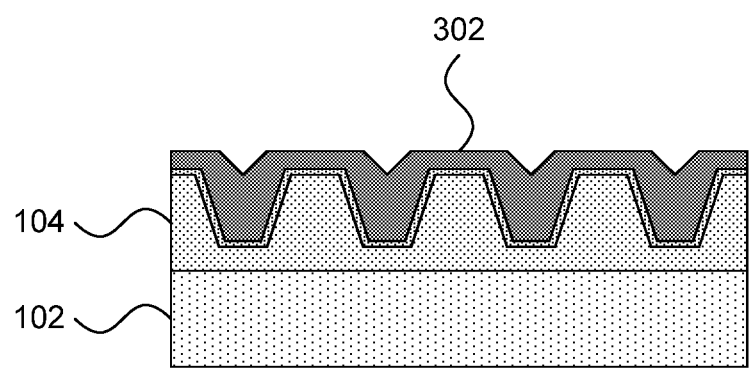
FIG. 3 is a cross-sectional view of an exemplary step in forming a conductor in a trench in accordance with the present principles.

Referring now to FIG. 3, a step in forming cobalt conductors is shown. An alloy of manganese and cobalt is deposited in the trenches 106 to form alloy layer 302. It is specifically contemplated that PVD may be used to deposit the alloy layer 302, but any appropriate deposition process may be used instead. The pure cobalt layer 202 is used as a wetting interface for the deposition and reflow of the alloy layer 302. In an embodiment that uses PVD for deposition of the alloy layer, the prior CVD deposition of the cobalt layer 302 provides better coverage, making the overall deposition process more efficient. It should be noted that the cobalt layer 202 may mix with the alloy layer 302 during deposition of the latter.

It is specifically contemplated that the alloy layer 302 may have a manganese percentage of about 1% to about 20%. Although an alloy of only manganese and cobalt is contemplated, other elements may be used as well in accordance with the design needs of the device.

Figure 4:
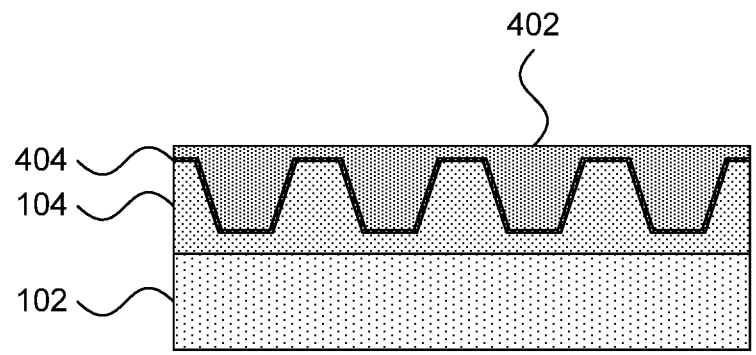
FIG. 4 is a cross-sectional view of an exemplary step in forming a conductor in a trench in accordance with the present principles.

Referring now to FIG. 4, a step in forming cobalt conductors is shown. A reflow anneal is performed that reflows the manganese/cobalt alloy layer 302. The anneal will be performed at a temperature suitable to melt the alloy layer 302. In the process, the manganese is driven out of the alloy layer 302 by diffusion. The manganese reacts with the material of the trench layer 104 to form a barrier layer 404, trapping the manganese at the interface and purifying the alloy layer 302. It is contemplated that the trench layer 104 is formed from a silicon oxide, such that the manganese reacts to form a manganese silicon oxide, in particular $MnSiO_3$. In one embodiment, a percentage of manganese in the alloy material is selected to be low enough to deplete entirely from the alloy layer 302, forming a purified cobalt layer 402. The barrier layer 404 prevents cobalt ions from penetrating into the oxide of the trench layer 104 during operation. This prevents electrical shorts and extends the usable lifetime of the device by decreasing conductor degradation. In addition, the barrier layer 404 prevents oxygen in the dielectric from intruding on interconnects with the conductor. This prevents oxidation and deterioration of interconnect resistance and reliability.

In one specific embodiment, the anneal may be performed between about 100 and about 400 degrees Celsius for about 1 to about 60 minutes. Alternatively, a rapid thermal anneal could be performed between about 300 degrees Celsius and about 700 degrees Celsius for about 1 to about 360 seconds. Laser annealing may be used to achieve a surface temperature above 700 degrees Celsius for sub-millisecond anneals. An ambient atmosphere of argon, nitrogen, or hydrogen may be used during the anneal.

Figure 5:
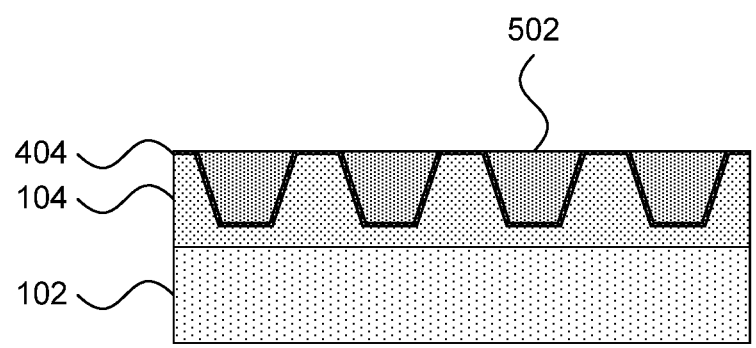
FIG. 5 is a cross-sectional view of an exemplary step in forming a conductor in a trench in accordance with the present principles.

Referring now to FIG. 5, a step in forming cobalt conductors is shown. Chemical mechanical planarization (CMP) is performed to remove any excess cobalt material from the top and to separate out different conductors 502. CMP is performed using, e.g., a chemical or granular slurry and mechanical force to gradually remove upper layers of the device. The slurry may be formulated to be unable to dissolve, for example, the manganese silicon oxide material forming the barrier layer 404, resulting in the CMP process's inability to proceed any farther than that layer. The CMP process removes any conductive material above the barrier layer 404 to prevent shorts between adjacent conductors 502.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 6:
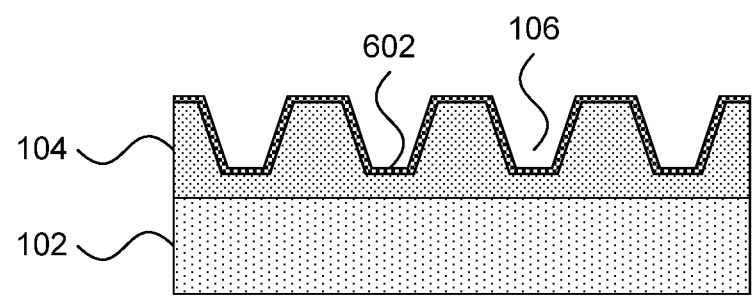
FIG. 6 is a cross-sectional view of an exemplary step in forming a conductor in a trench in accordance with the present principles.

Referring now to FIG. 6, a step in an alternative process of forming cobalt conductors is shown. This step follows the step shown in FIG. 1 above. Rather than depositing cobalt layer 202, a pure manganese layer 602 is deposited. The manganese material for the manganese layer 602 may be deposited using and appropriate process including, e.g., CVD, ALD, or PVD. The amount of material to be deposited can be tuned to combine completely with the underlying trench layer 104.

Figure 7:
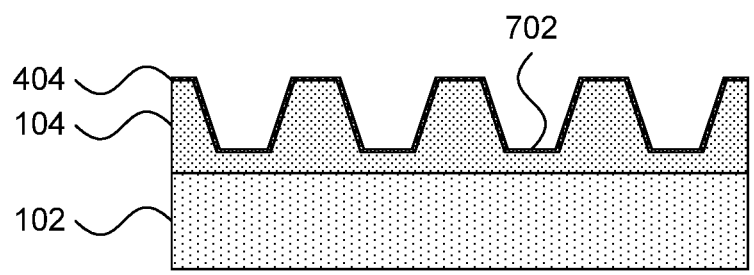
FIG. 7 is a cross-sectional view of an exemplary step in forming a conductor in a trench in accordance with the present principles.

Referring now to FIG. 7, a step in an alternative process of forming cobalt conductors is shown. In this step an anneal is performed that drives the manganese layer 602 into the material of the trench layer 104 to form barrier layer 702. It is contemplated that the trench layer 104 is formed from a silicon oxide, such that the manganese reacts to form a manganese silicon oxide, in particular $MnSiO_3$. In one embodiment, the thickness of the manganese layer 602 is selected to be entirely consumed in forming the barrier layer 602. In another embodiment, where the manganese layer 602 is thicker than can be completely consumed during the anneal, any remaining manganese material may be stripped from the inner surfaces of the trenches 106 by performing a wash in, for example, an acidic peroxide solution. This prevents remaining manganese material from interfering with the eventual deposition of the conductor.

Figure 8:
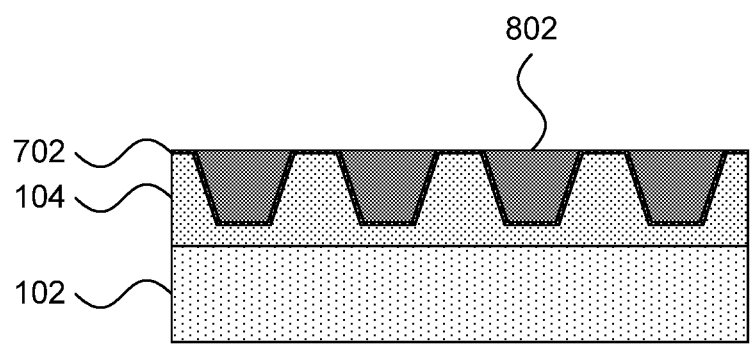
FIG. 8 is a cross-sectional view of an exemplary step in forming a conductor in a trench in accordance with the present principles.

Referring now to FIG. 8, a step in an alternative process of forming cobalt conductors is shown. In this step, a layer of cobalt 802 is filled in using any appropriate process including one of, e.g., CVD, PVD, ALD, and GCIB deposition. The cobalt layer 802 is filled to a height above the trenches 106 and subsequently polished down to the level of the barrier layer 702 using, e.g., CMP. As above, the CMP process removes any conductive material above the barrier layer 404 to prevent shorts between adjacent conductors 502.

Figure 9:
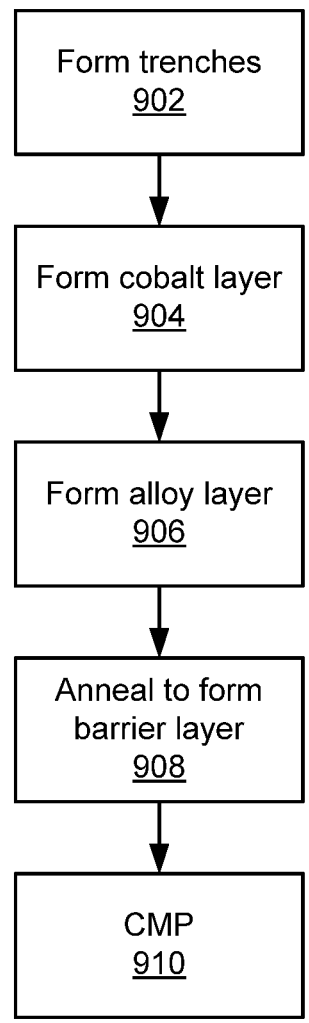
FIG. 9 is a block/flow diagram of a method of forming a conductor in a trench in accordance with the present principles.

Referring now to FIG. 9, a step in an alternative process of forming cobalt conductors is shown. Block 902 forms trenches 106 in the trench layer 104 using an appropriate anisotropic etch, such as RIE. Block 904 forms a uniform, conformal conductor layer 202 in the trenches 106 using, e.g., cobalt in a CVD process. Block 906 then forms the alloy layer 302 over the conductor layer 202 formed from, e.g., cobalt and manganese in a PVD deposition process. The percentage of the alloy constituents are selected to ensure that the manganese is entirely consumed in forming the barrier layer 404 in block 908.

Block 908 applies an anneal, heating the alloy layer 302 to reflow and fill any gaps as well as to drive the manganese in the alloy layer 302 into the underlying trench layer 104. It is specifically contemplated that the barrier layer 404 may be $MnSiO_3$, but the precise chemical composition will depend on the particular materials used in the alloy layer 302 and the trench layer 104. Block 910 then polishes the remaining cobalt layer 402 down to the level of the barrier layer 404 in a CMP process to separate the conductors 502.

Figure 10:
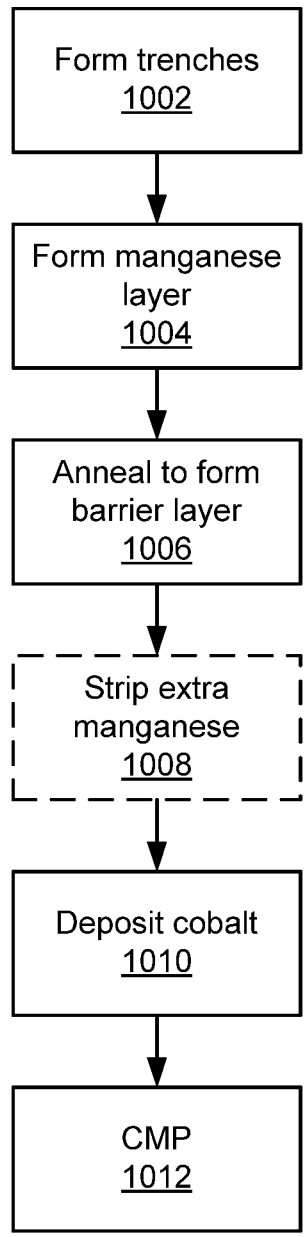
FIG. 10 is a block/flow diagram of a method of forming a conductor in a trench in accordance with the present principles.

Referring now to FIG. 10, an alternative method of forming cobalt conductors is shown. Block 1002 forms trenches 106 in the trench layer 104 using an appropriate anisotropic etch, such as RIE. Block 1004 forms a uniform, conformal manganese layer 602 in the trenches 106 using, e.g., a CVD process. Block 1006 then anneals the manganese layer 602 to form barrier layer 702 at the surface of the trenches 104, driving the material of the manganese layer 602 into the underlying trench layer 104. It is specifically contemplated that the barrier layer 702 may be MnSiO$_3$, but materials other than manganese and silicon oxides may be used instead. Block 1008 optionally strips remaining manganese from the trenches 106, if any remains from the manganese layer 602, using for example an acidic peroxide solution. Block 1010 then deposits a cobalt layer over the barrier layer 702 using any appropriate deposition process, such as CVD, ALD, PVD, or GCIB deposition. Block 1012 polishes the cobalt layer down to the level of the barrier layer 702 in a CMP process, separating the conductors 802.

Figure 11:
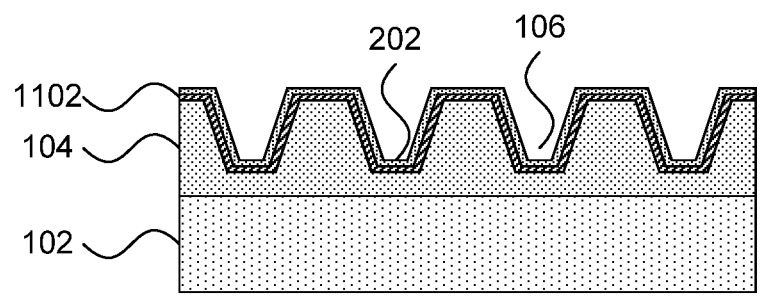
FIG. 11 is a cross-sectional view of an exemplary step in forming a conductor in a trench in accordance with the present principles.

Referring now to FIG. 11, a step in forming of alternative embodiment of cobalt conductors is shown. In any of the embodiments described above, where the trench layer 104 is formed from a dielectric material such as silicon dioxide, the cobalt layer 202 has good adhesion directly to the trench layer 104. However, if other materials are used in the trench layer 104, such as low-k dielectric films formed on a trench of some other material, the adhesion of cobalt directly on these materials may not be ideal under PVD or CVD. In such an embodiment, a thin adhesion layer 1102 formed from, for example, titanium nitride or tantalum nitride may be deposited directly on the trench layer 104 by, for example, PVD or ALD. The thickness and composition of the adhesion layer may be tuned such that it still allows manganese to diffuse through to form the barrier layer 404 during the anneal.

Figure 12:
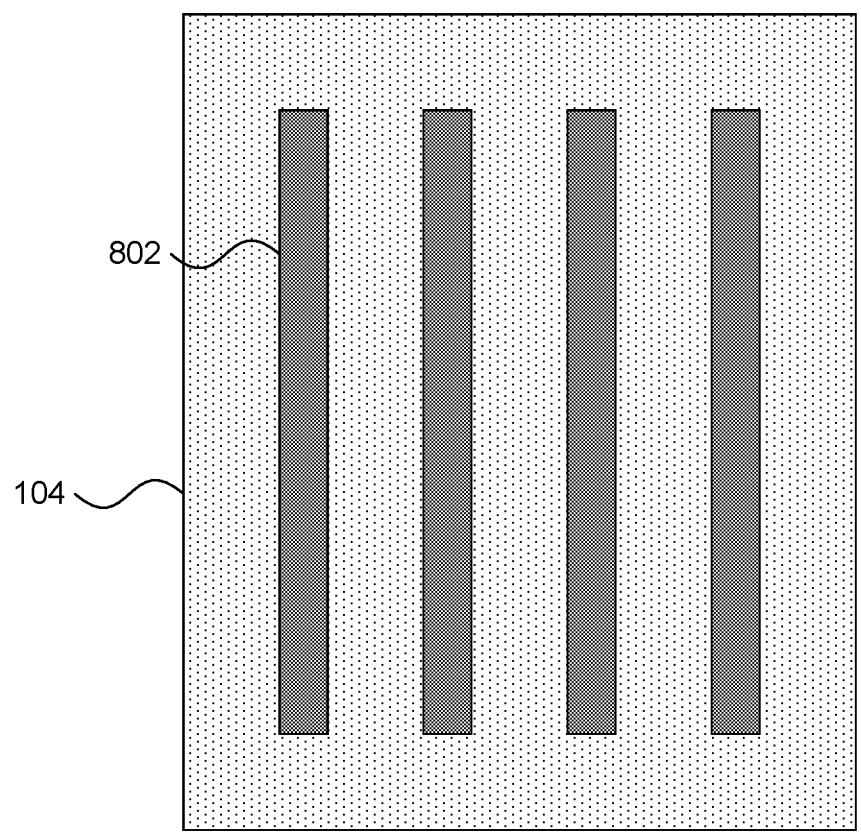
FIG. 12 is a top-down view of conductors in trenches in accordance with the present principles.

Referring now to FIG. 12, a top-down view of interconnects 702 is shown. The trench layer 104 is shown underlying the interconnects 702. In this embodiment, the exposed barrier layer 702 on top of the trench layer 104 has been removed through, e.g., a CMP process, but it should be understood that the barrier layer 702 may be left intact instead. A passivating layer of, e.g., silicon dioxide, may be deposited over the interconnects 802.

Figure 13:
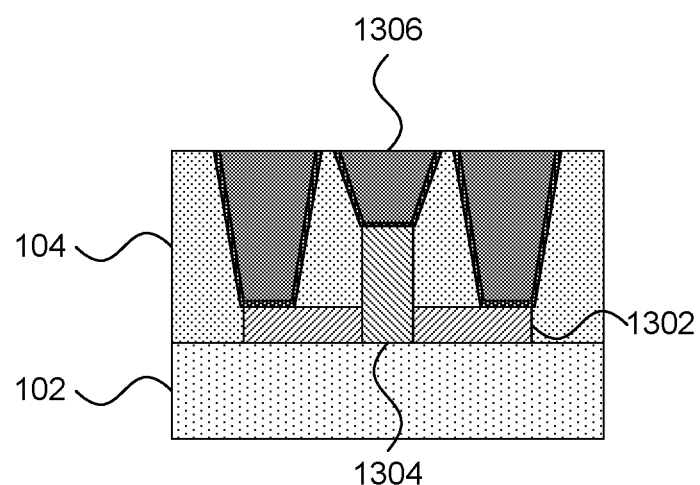
FIG. 13 is a cross-sectional view of contacts formed in accordance with the present principles in the context of a semiconductor device.

Referring now to FIG. 13, a cross-sectional view of an electrical contact 1302 is shown. The electrical contacts 1306 are formed in the same manner as the interconnects 802, but with a shorter length. In this embodiment, contacts 1306 penetrate the trench layer 104 to form electrical connections with a device, such as a field effect transistor. The contacts 1306 reach through the insulating trench layer 104 to make electrical contact with the source/drain 1302 and the gate 1304. The electrical contacts 1306 may form an electrical connection with one or more other devices, vias, or other conductors to integrate the connected device with the rest of the chip.

Having described preferred embodiments of a self-forming barrier for cobalt interconnects (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a conductor, comprising:
   forming trenches in an insulator layer;
   depositing an alloy layer, comprising a conductor material and a barrier material, in the trenches;
   annealing the alloy layer to form a barrier layer on the insulator layer and to purify the alloy layer into an elemental conductor layer, such that the barrier material in the alloy layer is driven to an interface between the alloy layer and the insulator layer; and
   polishing down a remaining portion of the alloy layer, stopping on the top surface of the barrier layer to leave the barrier layer on a top surface of the insulator layer between the trenches.

2. The method of claim 1, wherein the conductor material comprises elemental cobalt.

3. The method of claim 2, wherein the barrier material comprises elemental manganese.

4. The method of claim 3, the barrier material that is driven to the interface during annealing reacts with an insulator material of the insulator layer to form the barrier layer comprising manganese silicon oxide.

5. The method of claim 1, further comprising depositing a layer of elemental conductor material in the trenches before depositing the alloy layer, wherein annealing the alloy layer drives the barrier material through the layer of elemental conductor material to the interface.

6. The method of claim 1, further comprising forming an adhesion layer directly on a surface of the trenches before deposition of the alloy layer to enhance adhesion between the alloy material and the trench surfaces.

7. The method of claim 6, wherein the adhesion layer is formed from one of the group consisting of titanium nitride and tantalum nitride.

8. The method of claim 1, further comprising polishing the conductor layer down to a top level of the barrier layer using a chemical mechanical planarization process.

9. A method for forming a conductor, comprising:
   forming trenches in an insulator layer;
   depositing a layer of barrier material in the trenches;
   annealing the layer of barrier material to form a barrier layer on the insulator layer;
   etching away barrier material that did not react with the insulator layer during annealing;
   depositing a layer of conductor material over the barrier layer after etching away the excess barrier material; and
   polishing down the layer of conductor material, stopping on the top surface of the barrier layer to leave the barrier layer on a top surface of the insulator layer between the trenches.

10. The method of claim 9, wherein the conductor material comprises elemental cobalt.

11. The method of claim 10, wherein the barrier material comprises elemental manganese.

12. The method of claim 11, wherein the barrier layer comprises manganese silicon oxide.

13. The method of claim 9, further comprising polishing the conductor layer down to a top level of the barrier layer using a chemical mechanical planarization process.

* * * * *